United States Patent [19]
Nomura et al.

[11] Patent Number: 5,465,191
[45] Date of Patent: Nov. 7, 1995

[54] SINGLE HAND OPERABLE LATCH MECHANISM FOR HINGED CONTAINER

[75] Inventors: Hideo Nomura; Yoshiharu Uchiyama; Tetsuo Ogawa, all of Kanagawa, Japan

[73] Assignee: International Business Machines Corporation, Armonk, N.Y.

[21] Appl. No.: 133,532

[22] Filed: Oct. 7, 1993

[51] Int. Cl.[6] .............................. G06F 1/16; H05K 7/12; E05C 1/10
[52] U.S. Cl. ...................... 361/681; 361/732; 361/740; 361/759; 361/747; 292/42; 292/145; 292/DIG. 63
[58] Field of Search ............................... 292/33, 42, 145, 292/164, 175, DIG. 63; 220/326; 364/708.1; 361/680–683, 726, 732, 740, 759, 801, 747

[56] References Cited

U.S. PATENT DOCUMENTS 5,166,893  11/1992  Hosoi ........................................ 361/681

FOREIGN PATENT DOCUMENTS

3-101298  4/1991  Japan .
4-80786   3/1992  Japan .

Primary Examiner—Michael W. Phillips
Attorney, Agent, or Firm—Martin J. McKinley; Andrew J. Dillon

[57] ABSTRACT

A container having a body and a cover, in which the cover can be conveniently opened using only one hand from a latched state of the body and the cover. Engaging members between cover and body are movable under force, when the cover is closed, between an engaging position where the cover is engaged with said body and a releasing position where the cover is not engaged with the body. However, the engaging member cannot be returned to the engaging position while the cover is closed. Lock means prevent the engaging member from moving from the releasing position to the engaging position in spite of application of force. Once the cover is opened the engaging member moves from said releasing position to said engaging position.

5 Claims, 10 Drawing Sheets

SINGLE HAND OPERABLE LATCH MECHANISM FOR HINGED CONTAINER

BACKGROUND OF THE INVENTION

1. Technical Field

The present invention relates to a container having a body and a cover such as a notebook type personal computer, and more particularly to a mechanism for latching and releasing the cover with and from the body.

2. Description of the Related Art

A notebook PC generally has a latch mechanism for latching and releasing the cover with and from the system body, because it is necessary to prevent the closed cover from coming loose and from opening accidentally. An example of such a mechanism is disclosed in Japanese Published Unexamined Patent Application (PUPA) No. 4-80786. The latch mechanism is conventional, and provides latching hooks to a cover so as to engage the cover with a system body. In order to open the cover from the system body, an operation for releasing the hooks from the system body and an operation for lifting the cover itself are executed consecutively with the hooks held in the releasing position. If the latch mechanisms are provided to both of the right and left sides of the cover, the operations for releasing the right latch mechanism by the right hand and for releasing the left latch mechanism by the left hand must be done simultaneously and then held in the released state while lifting the cover by both hands. Therefore, the conventional latch mechanism is inconvenient to open, and impossible to open the cover using only one hand.

JA PUPA No. 3-101298 discloses a notebook PC having a handle for carrying extending from the cover. A latch mechanism is released in response to the operation of pushing the handle into the cover. In this mechanism, it is possible to open the cover using only one hand, since the handle can be pushed and the cover can be lifted by the same hand. However, in order to hold the latch mechanism in the released state, it is necessary to continue to push the handle. That is, since it is necessary to lift the cover simultaneously with pushing the handle. This mechanism is not convenient to operate either. Moreover, in this mechanism, complicated construction is required for linking the motion of the handle to the latch mechanism.

Also known is a mechanism including a spring for lifting a latching hook after release from a system body, thereby lifting a cover so as to keep a latch mechanism in a released state. However, such a mechanism, does not exhibit simplicity in construction since the spring for lifting the cover must be added. Besides, the proper strength of the spring depends on the weight of a cover to be lifted, friction caused by the rotation of a mounting shaft for the cover and the like. Accordingly, it is difficult to mount a relatively heavy cover including a color display apparatus and a relatively light cover including a monochrome display apparatus on a common system body so that they can be exchanged each other.

SUMMARY OF THE INVENTION

An object of the present invention is to provide a container having a body and a cover, wherein an operation for releasing the state where the cover is latched with the body and an operation for lifting the cover itself are not required to be executed simultaneously in order to open the cover.

It is a further object to provide simplified construction of such a container.

The above and other objects are met by the present invention which provides a container having a body and a cover, in which the cover can be conveniently opened using only one hand from a latched state of the body and the cover. Engaging members between cover and body are movable under force, when the cover is closed, between an engaging position where the cover is engaged with said body and a releasing position where the cover is not engaged with the body. However, the engaging member cannot be returned to the engaging position while the cover is closed. Lock means prevent the engaging member from moving from the releasing position to the engaging position in spite of application of force. Once the cover is opened the engaging member is allowed to move from said releasing position to said engaging position.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE INVENTION

Figure 1:
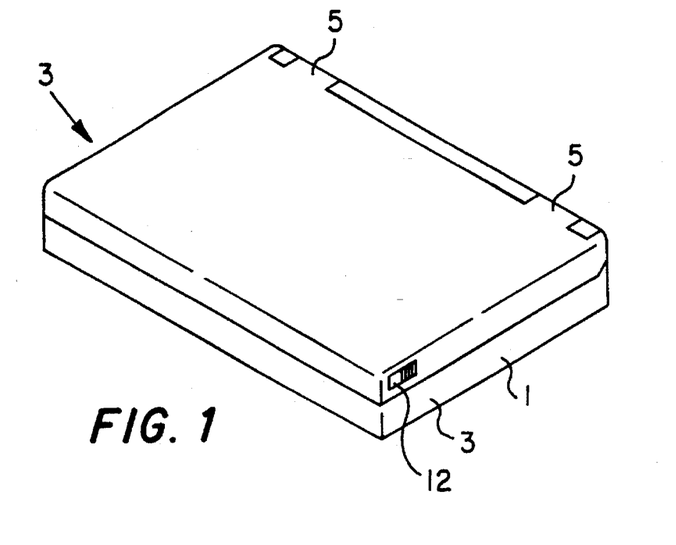
FIG. 1 is a perspective view of a notebook PC in the state where a cover is closed.
Figure 2:
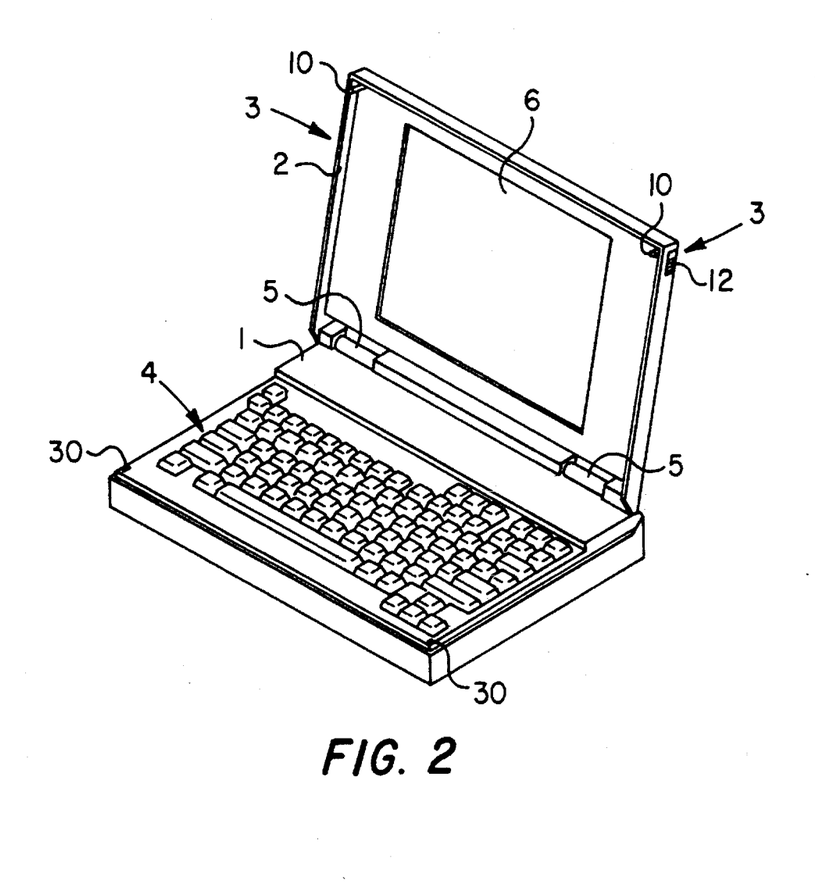
FIG. 2 is a perspective view showing a notebook PC in the state where a cover is opened.

FIG. 1 and FIG. 2 show an enclosure having a body and a cover, which is applied to a notebook PC. Mounted on a system body 1 is a cover 2. The cover 2 is capable of opening from the system body 1 on hinges 5. A latch mechanism 3 is provided to each of both sides of the cover 2. The latch mechanism 3 is for latching the cover 2 with the system body 1 and for releasing the cover from the body 1. In FIG. 2, a keyboard 4 as input means is provided on the top of the system body 1. The cover 2 is mounted on the system body 1 through hinges 5 at the rear of the system body 1. A flat display panel 6 is provided inside of the cover 2.

Figure 3:
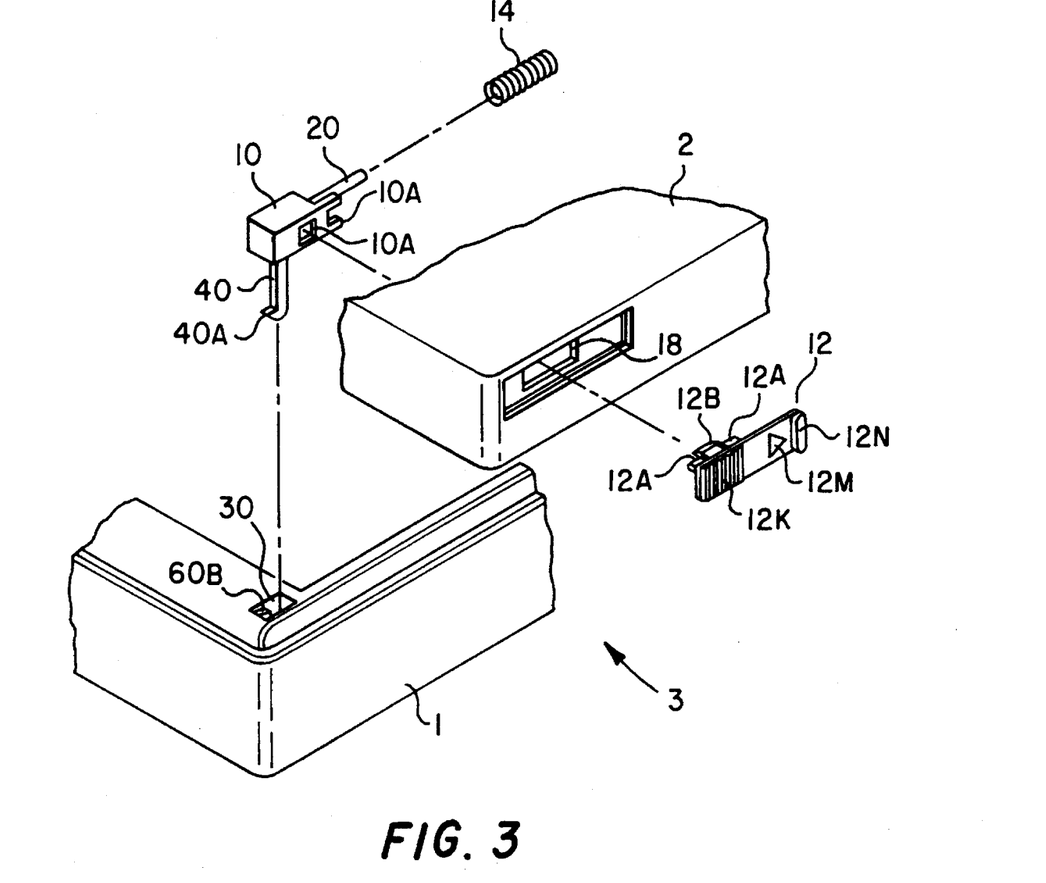
FIG. 3 is an exploded view of a preferred embodiment of the latch mechanism of the invention.

FIG. 3 is an exploded view of the latch mechanism 3. The latch mechanism 3 includes an engaging member 10, a slider 12, a spring 14, and a hollow 30. The engaging member 10, which is disposed inside the cover 2, is fixed to the slider 12 disposed outside the cover 2, through a slider guiding opening 18 which is formed in a side plate of the cover 2. It is preferable that the engaging member 10 and the slider 12 should be integrally formed by plastic materials. The slider guiding opening 18 supports the engaging member 10 and the slider 12 integrally formed, so that they can move only within a predetermined range along the longitudinal direction of the side plate of the cover 2. Formed in an exposed surface in the state where the slider 12 is attached to the cover 2 are a nonskid section 12K, a mark 12M, and a stopper 12N. The nonskid section 12K is intended to make the use of fingers for sliding the slider 12 easy. The mark 12M indicates the direction of operation of the slider 12. Further, an operator can operate the slider 12 not only by hitching a nail tip to the stopper 12N, but also by hitching a tip of such a stick as a mouse stick to the stopper 12N.

Figure 4:
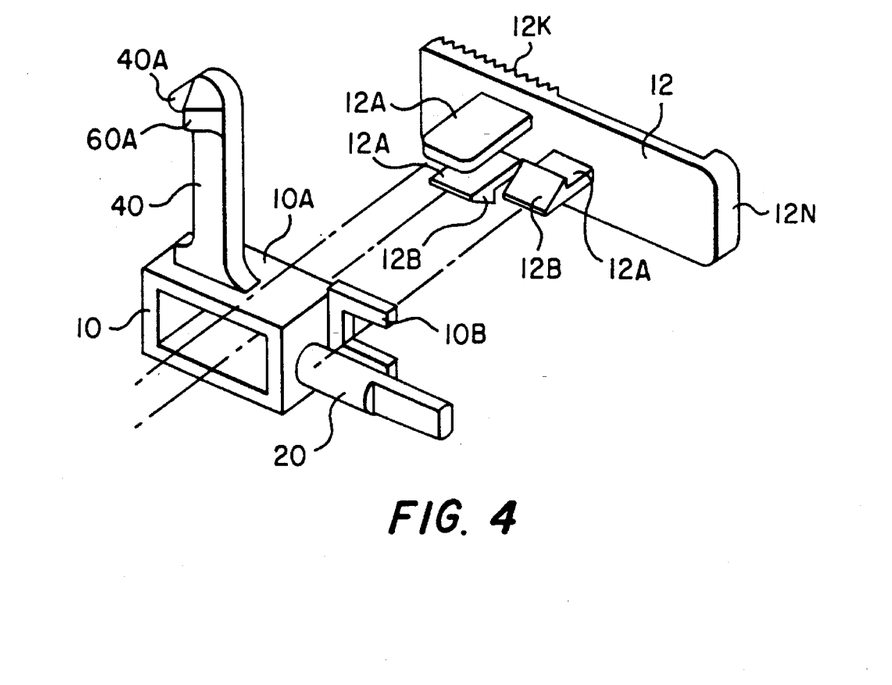
FIG. 4 is an exploded view showing an engaging member and a slider of said first embodiment.
Figure 5:
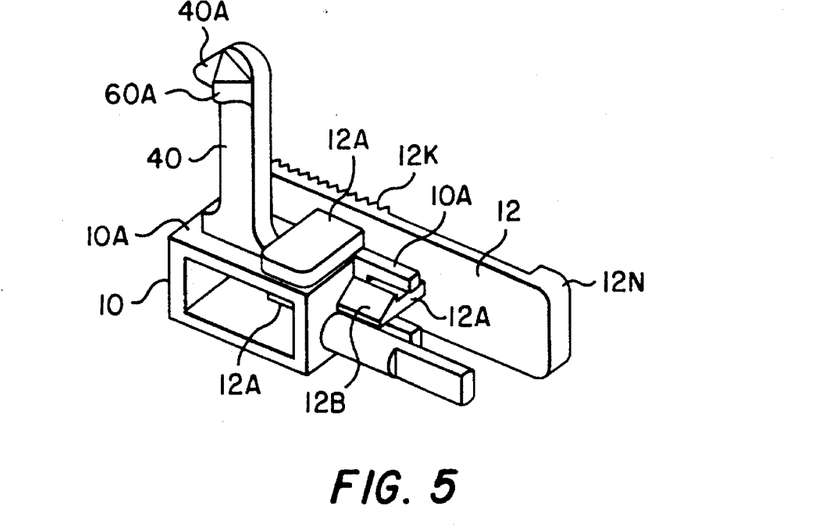
FIG. 5 is a perspective view showing the engaging member and the slider of said embodiment in the state where they are assembled.

FIG. 4 and FIG. 5 show the mounting relationship between the engaging member 10 and the slider 12 in FIG. 3, which are turned upside down. Planted into the inner wall of the slider 12 are a plurality of protrusions 12A for mounting. The tips of at least one part of a plurality of the protrusions 12A for mounting are shaped into a locking sections. On the other hand, the engaging member 10 has a plurality of female sections 10A so that the protrusions 12A for mounting are mounted into the female sections 10A. After the protrusions 12A for mounting are once mounted into the female sections 10 A, the slider 12 is kept in the state where it does not easily come off the engaging member 10 by means of the locking sections 12B.

In FIG. 3, the engaging member 10 has a shaft 20 which extends in the direction of movement of the engaging member 10 and the slider 12, and the spring 14 is attached to the shaft 20. The spring 14 is intended to spring the engaging member 10 toward the front end of the cover 2, that is, the left side in the figure. The engaging member 10 has a leg 40, and the leg 40 extends downward in the vertical direction toward the system body 1 in the figure. A tip 40A of the leg 40 is bent in an L-shape toward the left side in the figure, that is, toward the front end of the cover 2. On the other hand, the hollow 30 as an engaged member is formed in the top surface of the system body 1 so that the leg 40 can be housed into the hollow 30 in the state where the cover 2 is closed.

Figure 6:
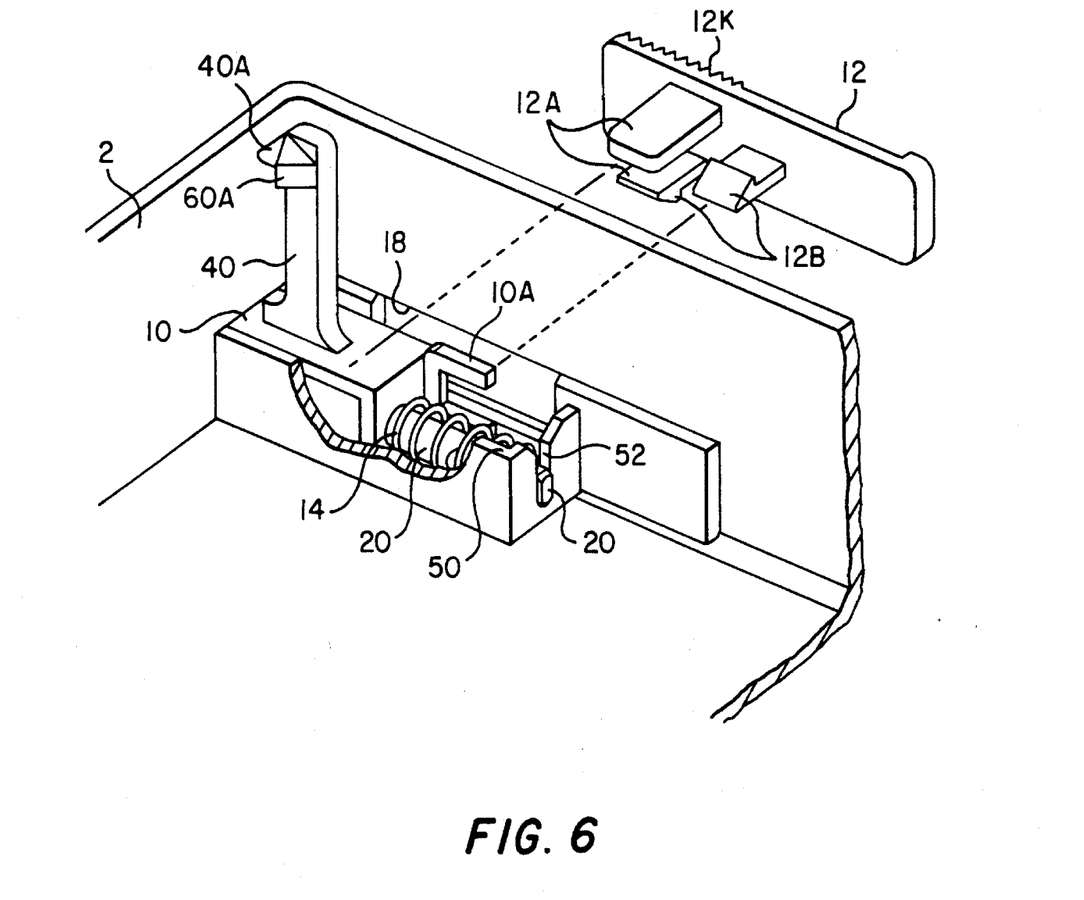
FIG. 6 is a perspective view showing mounting of the engaging member on the cover.

FIG. 6 shows the state where the engaging member 10 is mounted into the cover 2. In the figure, the cover 2 is shown from the inside. Formed in both sides close to the front edge of the inside of the cover 2 is a receptor 50 of the box-like type. The upper part of the receptor 50 in the figure is opened so that the engaging member 10 can be housed in the receptor 50 from its opening. Provided to the receptor 50 is a bearing 52. The bearing 52 is formed by notching part of peripheral walls which form the receptor 50 and supports the shaft 20 of the engaging member 10. One end of the spring 14 attached to the shaft 20 contacts an inside wall of the receptor 50, and the other end contacts a part of the engaging member 10 around the base end of the shaft 20. The spring 14 applies tensile force on the engaging member 10 in the receptor 50 toward the left side in the figure, that is, the front edge of the cover 2.

Figure 7:
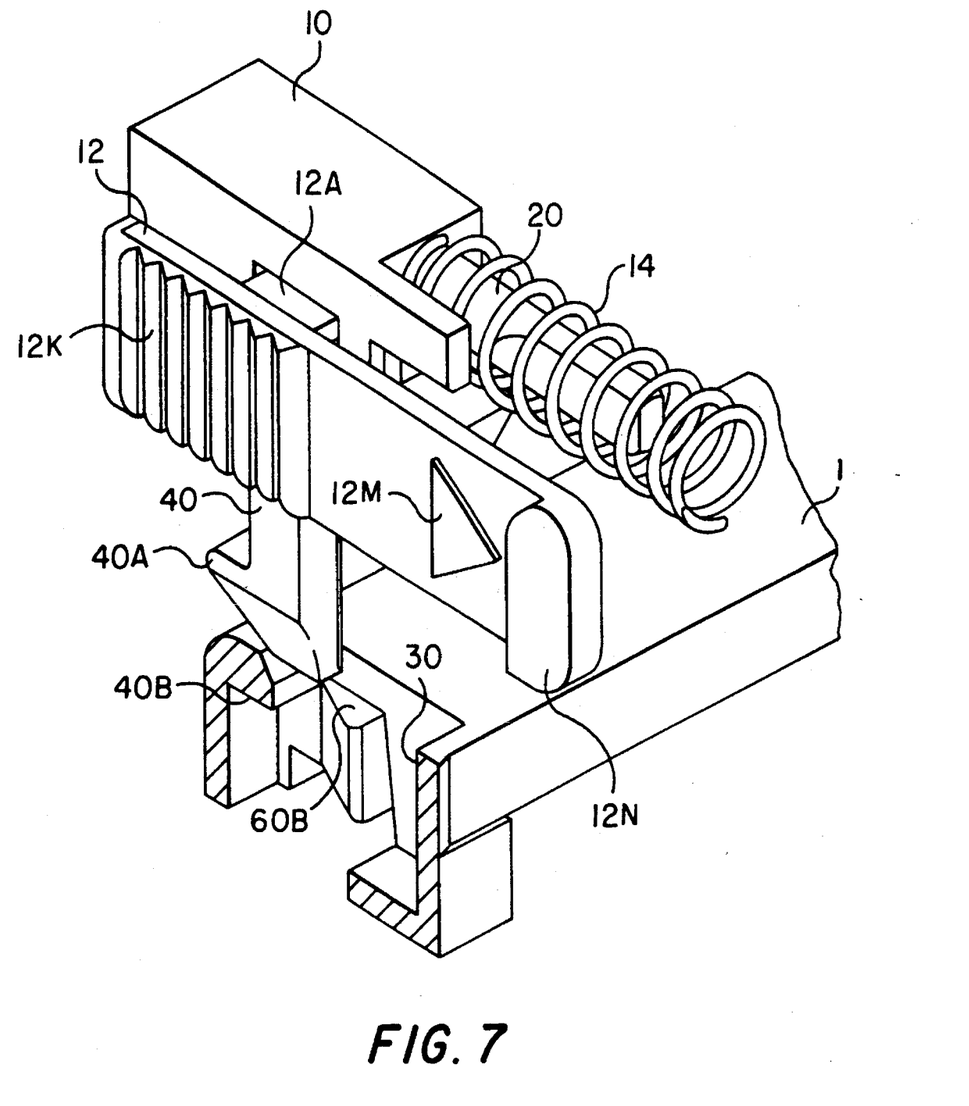
FIG. 7 is a perspective view showing the latch mechanism of the first embodiment in the state where the cover is opened from a system body.
Figure 8:
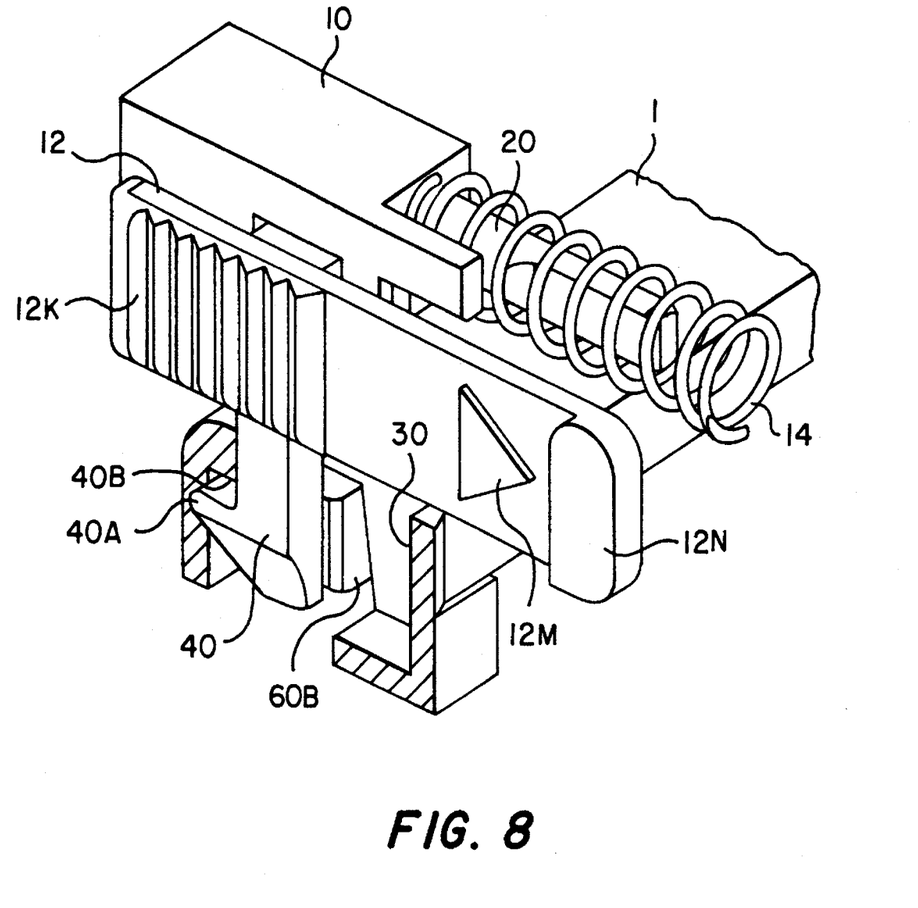
FIG. 8 is a perspective view showing the latch mechanism of the first embodiment in the state where the cover is latched with the system body.
Figure 9:
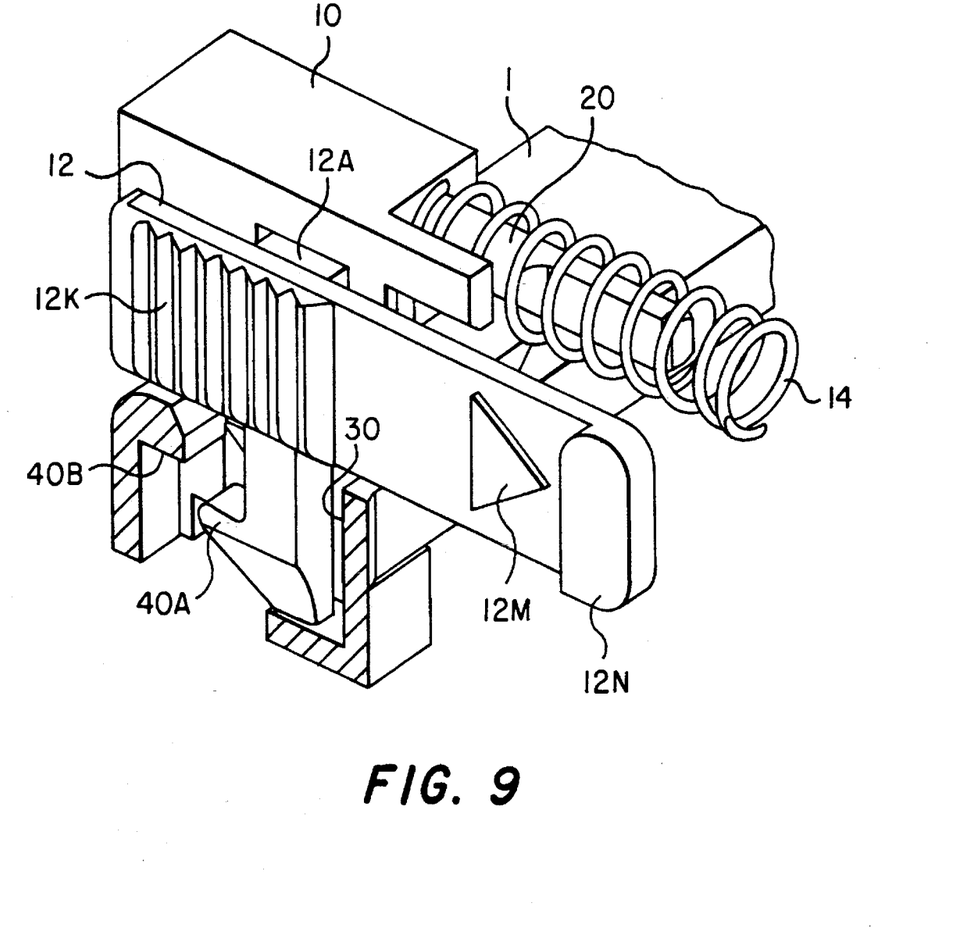
FIG. 9 is a perspective view showing the latch mechanism of the first embodiment in the state where the cover is closed on the system body, but is unlatched.

FIGS. 7 to 9 are enlarged perspective views of the latch mechanism 3. In the figures, a convex section 60B is formed in the hollow 30. On the other hand, as shown in FIGS. 4 to 6, a convex section 60A is formed also in the leg 40 of the engaging member 10. The convex sections 60A and 60B compose lock means 60 (see FIGS. 13 to 15). In the following, the lock means 60 is described in detail by reference to FIGS. 9 to 15 as well.

Figure 10:
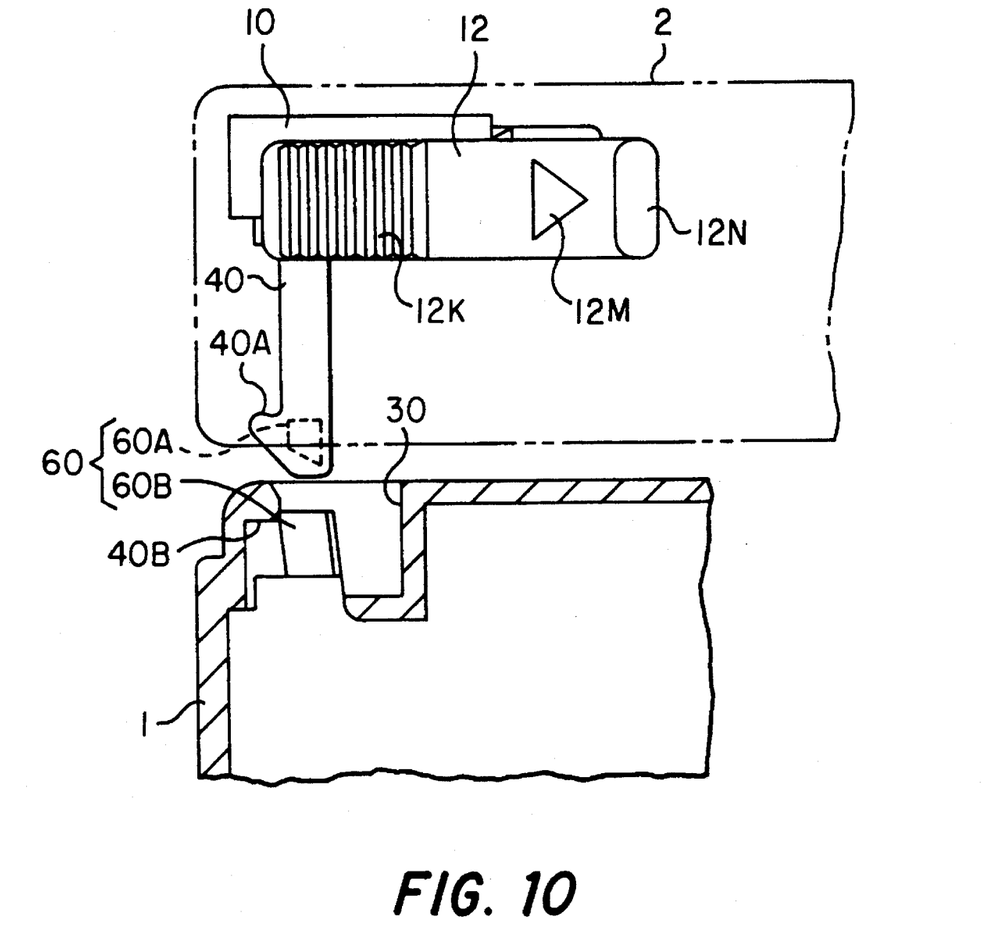
FIG. 10 is a partial sectional view showing the latch mechanism of the first embodiment in the state where the cover is lifted from the system body.

FIG. 7 and FIG. 10 show the state presented immediately before the cover 2 is closed or the state presented immediately after the cover 2 is opened from the system body 1. The engaging member 10 is at a leftmost position shown by FIG. 10 within a full range of its movement. When the engaging member 10 is at the position, the tip 40A of the leg 40 is located further left than the leftmost end of the opening of the hollow 30 in the figure. While the cover 2 is closed, the tip 40A contacts the top surface of the system body 1, gets over the leftmost end of the opening of the hollow 30 in the figure and then goes round the lower side of said end. When the tip 40A gets over the leftmost end of the opening of the hollow 30 in the figure, the engaging member 10 once moves to the right in the figure against the tensile force of the spring 14.

Figure 11:
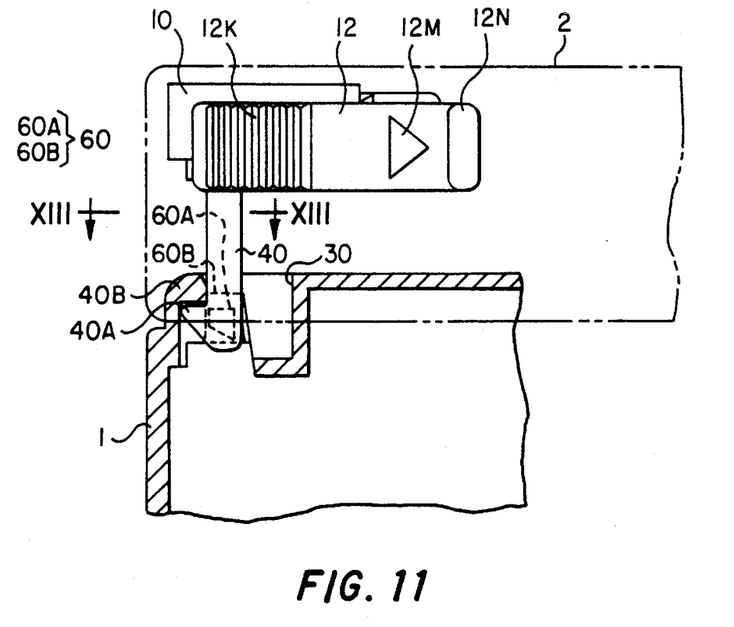
FIG. 11 is a partial sectional view showing the construction of the latch mechanism of the first embodiment in the state where the cover is latched with the system body.
Figure 13:
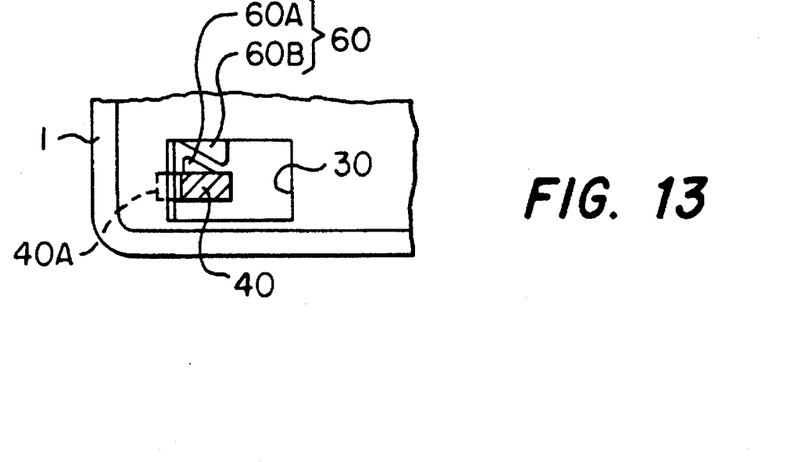
FIG. 13 is a sectional view taken in the line XIII—XIII of FIG. 11.

FIG. 8 and FIG. 11 show the state where the cover 2 is latched with the system body 1 after it is closed. The engaging member 10 is at a leftmost position shown by FIG. 11 within a full range of its movement in the hollow 30. The position of the engaging member 10 at this point is an engaging position. When the engaging member 10 is at the engaging position, the tip 40A of the leg 40 is located on the lower side of an engaged section 40B and prevents the cover from being opened from the system body 1. The spring 14 always applies tensile force on the engaging member 10 toward the left side in the figure so that such a state can be kept. As shown in FIG. 13, the convex sections 60A and 60B do not prevent the engaging member 10 from being at the engaging position.

Figure 14:
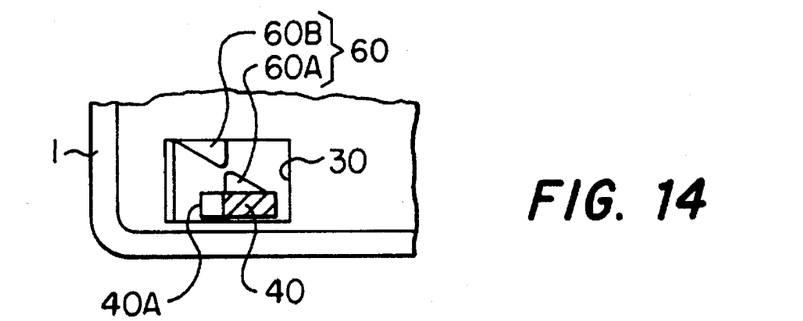
FIG. 14 is a sectional view showing a state that a convex section of a leg of the first embodiment takes when disposed over a convex section of a hollow.

To open the cover 2, the engaging member 10 may be moved toward the right side in FIG. 11 by operating the slider 12. The direction of its movement is indicated by the arrow 12M. As shown in FIG. 14, with the movement of the engaging member 10, the convex section 40A of the leg 40 is intended to get over the convex section 40B of the hollow 30. That is, the convex section 40A of the leg 40 and the convex section 40B of the hollow 30 are intended not to prevent the engaging member 10 from moving toward the right side in the figure. A slope for helping such movement is formed in each of the convex section 40A of the leg 40 and the convex section 40B of the hollow 30. In the process of moving the engaging member 10 toward the right side in the figure, as shown in FIG. 14, the convex section 40A of the leg 40 once strikes on the convex section 40B of the hollow 30. When striking on it, at least the part of the convex section 40A of the leg 40 must move also vertically to the direction of movement of the entire engaging member 10, but the shape and size of the hollow 30, the material of the engaging member 10, and the positioning scope of the engaging member 10 during assembling into the receptor 50 allow for such movement.

Figure 12:
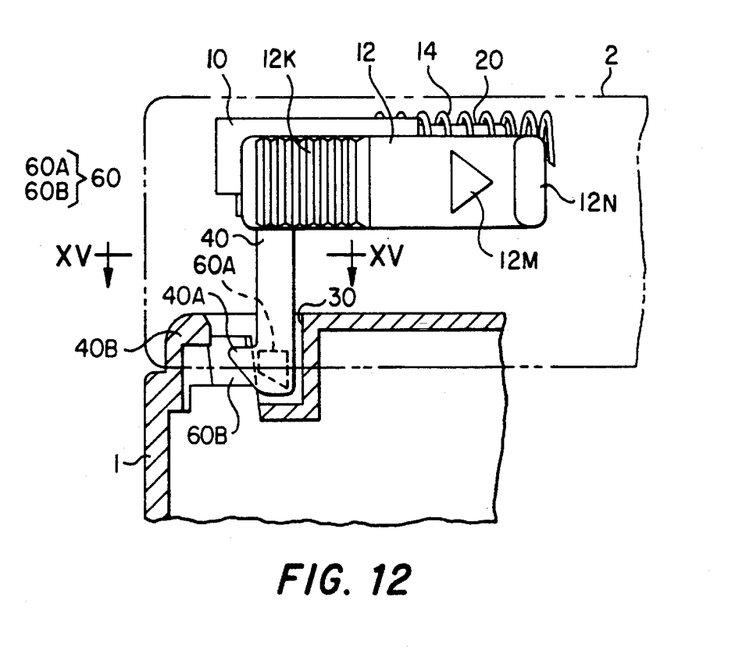
FIG. 12 is a sectional view showing the construction of the latch mechanism of said embodiment in the state where the cover is closed on the system body, but is unlatched.
Figure 15:
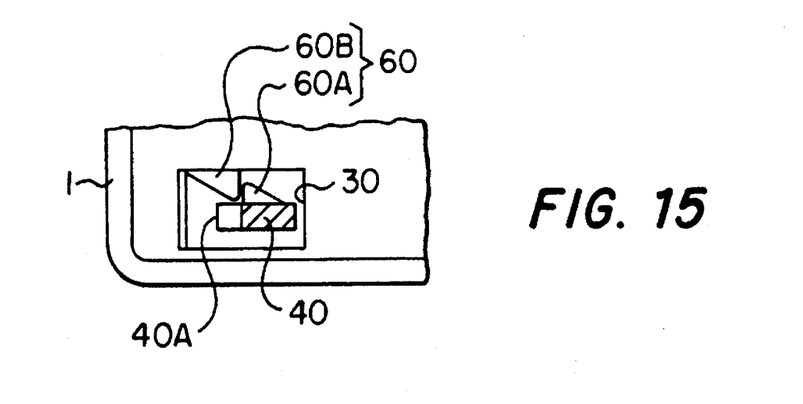
FIG. 15 is a sectional view taken in the line XV—XV of FIG. 12.

FIG. 9, FIG. 12, and FIG. 15 show the state that the engaging member 10 was once moved along the arrow 12M before the cover 2 is opened. In the state, the tip 40A of the leg 40 is released from the engaged section 40B. A position of the engaging member 10 at this point is a releasing position. When the engaging member 10 is moved to the releasing position in the state where the cover 2 is closed, the convex section 40A of the leg 40 is prevented from moving toward the left side in the figure by the convex section 40B of the hollow 30. Therefore, the cover 2 remains unlatched to the system body 1 since the engaging member 10 is held at the releasing position against the force of the spring 14. When the cover 2 is lifted, the engaging member 10 is returned to the state shown in FIG. 7 and FIG. 10, that is, the engaging position, due to the tensile force of the spring 14 since the convex section 40A of the leg 40 rises and separates from the convex section 40B of the hollow 30.

According to such an embodiment as described above, once the slider 12 is pushed backward in the state where the cover 2 is closed, the state is kept where the latch mechanism 3 of the cover 2 to the system body 1 is released. Therefore, it is possible to open a cover even if an operation for releasing the state where the cover is latched with a body and an operation for lifting the cover itself are not practiced simultaneously. Accordingly, even if the latch mechanism 3 is provided to each of both sides of the cover 2, it is also possible to open the cover 2 by one hand by releasing the latch, one side at a time, and then by lifting the cover 2. Further, since the engaging member 10 and the slider 12 return to the engaging position once the cover 2 is opened, any operation to the engaging member 10 and the slider 12 for returning them to the engaging position is not needed. Still further, since the direction of the operation of the slider 12 is from the front to the rear and the stopper 12N is also provided to the slider 12, it is also possible to release the state where the cover 2 is latched using such a cylindrical body as a mouse stick.

Further, since the lock means 60 has a very simple construction which is composed of the two convex sections 60A and 60B, the installation of the lock means 60 does not cause a latch mechanism to be complicated. Further, since parts to be adjusted according to variations in weight etc. of the cover side are not included, it is possible to mount, without any hindrance, covers 2 different from one another in weight etc. on a common system body 1 so that they can be exchanged each other.

Though the latch mechanism 3 is illustrated on each of both sides of the cover 2, a single latch mechanism 3 may be provided to the front edge etc. of the cover 2. Further, the latch mechanism 3 may have such construction as the state where the cover 2 is latched is released when the slider 12 is slid from the rear to the front. Still further, convex sections which compose lock means may not be provided to both, but only one of an engaging member and a body. Further, an engaging member and a member equivalent to a leg may be provided to a body, instead of a cover, and a section to be engaged may be provided to the cover. Still further, it will be appreciated that the present invention may be applied not only to a notebook PC, but also to other various enclosures having a cover.

According to the present invention, it is possible to provide an enclosure having a cover, in which the cover can be opened even if the latching mechanism is not held open during lifting of the cover. Complication in construction is avoided, and parts to be adjusted according to variations in weight and frictional resistance of the cover are not included.

While the invention has been particularly shown and described with reference to a preferred embodiment, it will be understood by those skilled in the art that various changes in form and detail may be made therein without departing from the spirit and scope of the invention.

What is claimed is:

1. A container comprising:

a body;

a cover to the body hingedly mounted to the body along one side to be opened and closed;

an engaging member provided on at least one of said cover or said body,. wherein said engaging member is movable by force between a position for engaging the cover with the body and a position for releasing the cover from the body when the cover is closed; and lock means for preventing the engaging member from being moved from the position for releasing the cover to the position for engaging the cover after the engaging member is moved from the position for engaging to the position for releasing when the cover is closed, and for allowing the engaging member to move from the position for releasing the cover to the position for engaging the cover when the cover is opened.

2. A container as set forth in claim 1, wherein said lock means includes a hollow having a convex portion, said convex portion allowing for said engaging member to move from said position for engaging to said position for releasing, but preventing said engaging member from moving from said position for releasing to said position for engaging.

3. An information processing apparatus comprising:

a system body;

a cover which is operable to open and close from and to the system body;

an engaging member for engaging the cover with the system body at an engaging position and for releasing the cover from the system body at a releasing position when the cover is closed, the engaging member being movable between the engaging position and the releasing position, and the engaging member being provided on at least one of said cover and the system body; and lock means for preventing the engaging member from moving from the releasing position to the engaging position after the engaging member is moved from the engaging position to the releasing position when the cover is closed, and for allowing the engaging member to move from the releasing position to the engaging position when the cover is opened.

4. An information processing apparatus comprising:

a system body;

input means for inputting data, the input means being provided on the system body;

a cover depending from the system body, being movable between an open and a closed position with respect to the system body;

a display on the inside of the cover;

an engaging member for engaging the cover with the system body at an engaging position and for releasing the cover from the system body at a releasing position when the cover is in the closed position, the engaging member being movable under force from the engaging position to the releasing position and the engaging member being provided on at least one of the cover and the system body; and lock means for preventing the engaging member from moving from the releasing position to the engaging position after the engaging member is moved from the engaging position to the releasing position when the cover is in the closed position, and for allowing the engaging member to move from the releasing position to the engaging position when the cover is in the opened position.

5. The information processing apparatus according to claim 4, wherein said cover includes a plurality of side edges and a front edge, and wherein said engaging member is movable along an axis parallel to said side edges of said cover, and said engaging position is located closer to said front edge of said cover along said axis parallel to said side edges than said releasing position.

* * * * *